United States Patent
Tsai

(10) Patent No.: US 7,208,366 B2
(45) Date of Patent: Apr. 24, 2007

(54) BONDING GATE OXIDE WITH HIGH-K ADDITIVES

(75) Inventor: Wilman Tsai, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 62 days.

(21) Appl. No.: 10/917,886

(22) Filed: Aug. 12, 2004

(65) Prior Publication Data

US 2005/0012164 A1   Jan. 20, 2005

Related U.S. Application Data

(62) Division of application No. 10/425,511, filed on Apr. 28, 2003.

(51) Int. Cl.
*H01L 21/8238* (2006.01)

(52) U.S. Cl. ............... 438/216; 438/287; 438/591; 438/785

(58) Field of Classification Search ............. 438/197, 438/216, 240, 785, 287, 591
See application file for complete search history.

(56) References Cited

U.S. PATENT DOCUMENTS

| 5,810,923 | A | * | 9/1998 | Yano et al. | ............ | 117/84 |
| 2003/0183870 | A1 | * | 10/2003 | Sugiyama et al. | ........ | 257/314 |
| 2003/0215996 | A1 | * | 11/2003 | Putkonen | ............ | 438/240 |
| 2004/0152340 | A1 | * | 8/2004 | Yamamoto et al. | ........ | 438/778 |

* cited by examiner

*Primary Examiner*—Jack Chen
(74) *Attorney, Agent, or Firm*—George Chen

(57) ABSTRACT

A technique for producing a thin gate oxide having a relatively high dielectric constant. Embodiments relate to the structure and development of a gate oxide having a thickness of less than 1 nm, having a dielectric constant greater than twenty, and being substantially free of undesired electrical characteristics caused by exposure of the gate oxide to high complementary metal-oxide-semiconductor processing temperatures.

4 Claims, 2 Drawing Sheets

BONDING GATE OXIDE WITH HIGH-K ADDITIVES

CROSS REFERENCE TO RELATED APPLICATIONS

The present application is a divisional of application Ser. No. 10/425,511, filed Apr. 28, 2003, entitled A HIGH K OXIDE, which is assigned to the same assignee as the present application.

FIELD

Embodiments of the invention relate to semiconductor manufacturing. More particularly, embodiment of the invention relate to the formation of a thin, thermally stable, substantially defect-free gate oxide within a complementary metal-oxide-semiconductor ("CMOS") device.

BACKGROUND

As CMOS devices continue to decrease in size, the need for smaller gate oxides increases, while the need for a relatively high overall oxide dielectric constant remains. Gate oxides typically consist of a combination of a relatively high k (dielectric constant) dielectric and a relatively moderate k dielectric to produce an overall oxide dielectric constant that is somewhere in between the two. Furthermore, the use of typical oxides, such as zirconium-dioxide ("$ZrO_2$") and hafnium-dioxide ("$HfO_2$"), by themselves is generally undesirable, because volumetric expansion from thermal anneal cycles in semiconductor processing can result in the formation of defects in the oxide, causing leakage and reliability problems in the transistor.

Therefore, additives, such as aluminum-trioxide ("$Al_2O_3$"), are typically combined with the oxide to help it remain amorphous during exposure to high temperatures in processing. The combination of additives, such as $Al_2O_3$, and typical oxides, such as $ZrO_2$ and $HfO_2$, however, can result in an overall effective dielectric constant (k) that is lower than necessary to accommodate thinner oxides (<1 nm) required in modern CMOS processes. Furthermore, additives, such as $Al_2O_3$, can possess fixed charge problems as a result of the bonding configuration between the additive and the oxide.

Typical gate oxides in modern CMOS processes require a dielectric constant of at least twenty in order to support a dielectric thickness of 1 nm or less reliably. Furthermore, gate oxides must be able to withstand deteriorating effects, such as oxygen-deficient defects and thermal instability, caused by exposure to high temperatures during processing.

BRIEF DESCRIPTION OF THE DRAWINGS

Embodiments of the invention are illustrated by way of example and not limitation in the figures of the accompanying drawings, in which like references indicate similar elements and in which.

DETAILED DESCRIPTION

Embodiments of the invention described herein relate to complementary metal-oxide-semiconductor ("CMOS") processing. More particularly, embodiments of the invention relate to the creation of a gate oxide being sufficiently thin, possessing appropriate physical reliability, and having a suitable dielectric constant so as to be compatible with modern CMOS processing technology.

Figure 1:
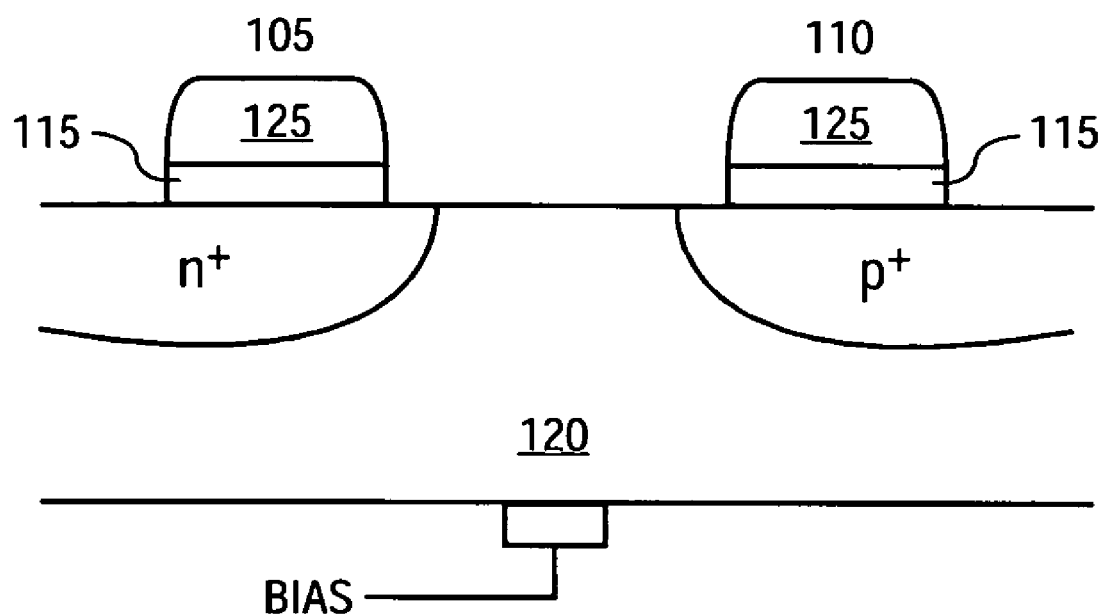
FIG. 1 is a typical CMOS semiconductor device in which at least one embodiment of the invention may be used.

FIG. 1 illustrates a CMOS device in which one embodiment of the invention may be used. The device of FIG. 1 is an inverter, which consists of an n-type transistor 105 and a p-type transistor 110. In each of the transistors is a gate oxide 115, across which an electric field is created when a gate voltage is applied to the gate 125 while the body 120 is biased at a lower potential than the gate.

The gate oxide in typical modern CMOS devices is less than 1 nm thick, but should also have a dielectric constant greater than twenty in order to support the electric field applied from the gate to the substrate. Because thinner oxides require less dielectric material than thicker oxides, the dielectric constant (k) should be sufficiently high to compensate for the thinner dielectric.

The n-type dielectric typically consists of $ZrO_2$, whereas the p-type dielectric typically consists of $HfO_2$. In order to achieve the dielectric constant required by a gate oxide of less than 1 nm, high k additives, such as yttrium-trioxide ("$Y_2O_3$"), lanthanum-trioxide ("$La_2O_3$"), and titanium-dioxide ("$TiO_2$"), are combined with the oxides, $ZrO_2$ and $HfO_2$, in one embodiment of the invention. The combined dielectric constant of $ZrO_2$ or $HfO_2$ and any one of the above high k additives is sufficiently high (>20) to support an electric field across a gate oxide of less than 1 nm. Furthermore, the above additives are substantially free of the fixed charge problems associated with additives, such as $Al_2O_3$, when bonded with the oxides.

Other additives in other embodiments of the invention may be used that can be bonded with $ZrO_2$ and $HfO_2$ without the combination suffering from fixed charge problems while yielding an overall effective dielectric constant necessary to support a particular gate oxide thickness. Furthermore, the particular ratio between one of the above additives and the combined oxide depends upon the dielectric constant that is desired for the application and not limited to the embodiment of the invention discussed above.

Figure 2:
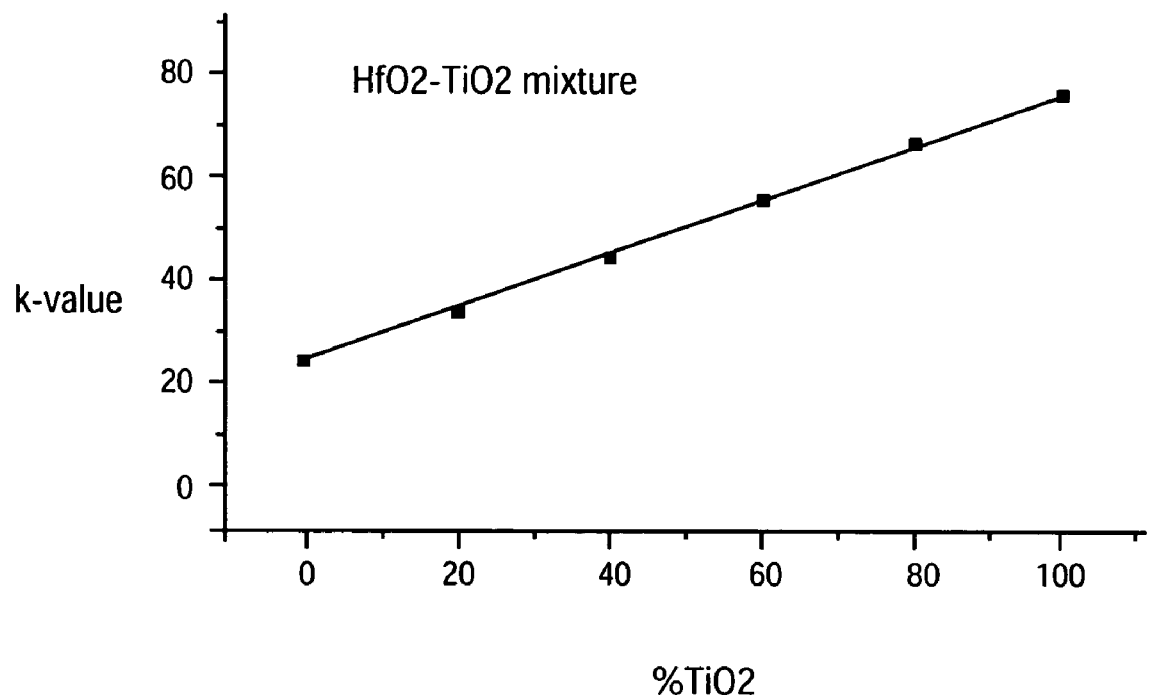
FIG. 2 is a graph displaying the dielectric constant of an oxide as a function of its $TiO_2$ content, according to one embodiment of the invention.

FIG. 2, for example, is a graph illustrating the effective gate oxide's dielectric constant as a function of the percentage of $TiO_2$ combined with $HfO_2$. Advantageously, the relationship between the $TiO_2$ content and the gate oxide dielectric constant is substantially linear when $TiO_2$ is combined with any one of the oxides, $ZrO_2$ or $HfO_2$.

Figure 3:
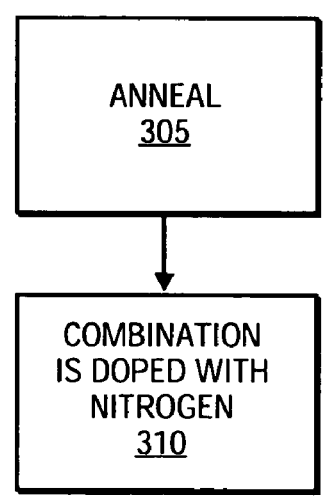
FIG. 3 is a flow diagram illustrating a portion of a semiconductor process that may be used in conjunction with one embodiment of the invention.

FIG. 3 is a flow diagram illustrating at least some of the process operations that may be used to carry out one embodiment of the invention. The particular point in the process in which these operations are used is dependent upon the particular process being used. At operation 301, $ZrO_2$ and $HfO_2$ are combined with any one of the additives, $Y_2O_3$, $La_2O_3$, and $TiO_2$, in order to form a gate oxide having a high crystallization onset and sufficient dielectric constant of at least twenty while not displaying the fixed charge problems associated with some additives, such as $Al_2O_3$.

In order to avoid oxygen-deficient defects that can result in various undesirable electrical properties of the gate oxide when used in a transistor, the combination is cured by exposing the gate oxide to a low oxygen partial pressure anneal at operation 305. The anneal operation exposes the gate oxide to a minimum oxygen ambient atmosphere to cure defects while minimizing interfacial oxide growth, which can happen rapidly at certain atmospheric pressures for high k materials. For the embodiment illustrated in FIG. 3, a partial pressure of <$1\times10^{-3}$ Torr is used in order to avoid undesirable oxide leakage and interfacial oxide growth. The particular anneal pressure and temperature to be used depends upon the particular oxide and additive combination used to form the gate oxide.

At operation 310, the combination is doped with nitrogen in order to promote thermal stability at high temperatures, such as >1000 C, during CMOS processing. Nitrogen may be introduced to the combination via various process techniques, including plasma nitridation, thermal nitrogen anneal containing an ambient, such as nitrogen-hydroxide ("$NH_3$"), nitrous-oxide ("NO"), nitrous-dioxide ("$NO_2$"), and nitrogen ("$N_2$"), and implantation. The particular doping technique as well as the ambient to be used with the thermal nitrogen anneal is dependent upon the needs of the particular semiconductor process being used.

While the invention has been described with reference to illustrative embodiments, this description is not intended to be construed in a limiting sense. Various modifications of the illustrative embodiments, as well as other embodiments, which are apparent to persons skilled in the art to which the invention pertains are deemed to lie within the spirit and scope of the invention.

What is claimed is:

1. A process comprising:

forming a gate oxide, the gate oxide comprising $ZrO_2$ and $HfO_2$;

bonding the gate oxide with high-k additives, the high-k additives comprising $Y_2O_3$, $La_2O_3$, and $TiO_2$;

curing oxygen-deficient defects in the gate oxide while minimizing interfacial oxide growth;

promoting thermal stability during CMOS processing at high temperatures greater than 1000 C, and forming a combined dielectric, the combined dielectric having a thickness of less than 1 nm, the combined dielectric having a dielectric constant of greater than twenty, the combined dielectric not displaying fixed charge problems, and the combined dielectric having a high crystallization onset to remain substantially amorphous.

2. The process of claim 1 wherein the gate oxide is annealed by exposing the gate oxide to a low-oxygen ambient atmosphere at a pressure range that is less than $1\times10^{-3}$ Torr.

3. The process of claim 2 wherein the gate oxide is doped with nitrogen by a process chosen from a group consisting of plasma nitridation, thermal nitrogen ambient anneal, and implantation.

4. The process of claim 3 wherein the nitrogen ambient includes a compound chosen from a group consisting of $NH_3$, NO, $NO_2$, and $N_2$.

* * * * *